United States Patent
Wunnicke et al.

(10) Patent No.: US 7,459,990 B2
(45) Date of Patent: Dec. 2, 2008

(54) ARRANGEMENT WITH TWO PIEZOELECTRIC LAYERS, AND METHOD OF OPERATING A FILTER DEVICE

(75) Inventors: Olaf Wunnicke, Eindhoven (DE); Hans P. Loebl, Monschau-Imgenbroich (DE); Mareike K. Klee, Straelen (DE); Robert F. Milsom, Redhill (GB)

(73) Assignee: NXP B.V., Eindhoven (NL)

( * ) Notice: Subject to any disclaimer, the term of this patent is extended or adjusted under 35 U.S.C. 154(b) by 635 days.

(21) Appl. No.: 10/128,815

(22) Filed: Apr. 24, 2002

(65) Prior Publication Data

US 2002/0175781 A1    Nov. 28, 2002

(30) Foreign Application Priority Data

Apr. 25, 2001  (EP) .................................. 01201647

(51) Int. Cl.
*H03H 9/70*   (2006.01)
*H03H 9/54*   (2006.01)

(52) U.S. Cl. ....................................... 333/133; 333/188

(58) Field of Classification Search ................ 333/187, 333/188, 189, 191, 192, 133; 310/320, 324, 310/321

See application file for complete search history.

(56) References Cited

U.S. PATENT DOCUMENTS

| 3,109,153 A | * | 10/1963 | Rodek ........................ 333/188 |
| 4,096,756 A | * | 6/1978 | Alphonse ................ 333/188 X |
| 5,446,306 A | * | 8/1995 | Stokes et al. ................ 257/416 |
| 5,910,756 A | * | 6/1999 | Ella ........................ 333/189 X |

FOREIGN PATENT DOCUMENTS

EP          0962999 A2    6/1999

\* cited by examiner

*Primary Examiner*—Benny Lee
(74) *Attorney, Agent, or Firm*—Peter Zawilski

(57) ABSTRACT

The invention relates to an arrangement with two piezoelectric layers (2, 5) and to a method of operating the arrangement as a filter. One (2) of the two piezoelectric layers (2, 5) in the arrangement is situated between an electrode (3) and a middle electrode (4), and the other one (5) of the two piezoelectric layers (2, 5) is positioned between another electrode (6) and said middle electrode (4) such that a bulk acoustic wave resonator is formed. The one and the other electrode (3, 6) and the middle electrode (4) are connected to circuitry means for applying high-frequency signals to at least one of the two piezoelectric layers (2, 5) such that the bulk acoustic wave resonator has at least one resonance frequency when the circuitry means are in one switching state, and that the bulk acoustic wave resonator has at least one other resonance frequency different from the at least one resonance frequency when the circuitry means are in another switching state.

15 Claims, 3 Drawing Sheets

ARRANGEMENT WITH TWO PIEZOELECTRIC LAYERS, AND METHOD OF OPERATING A FILTER DEVICE

BACKGROUND OF THE INVENTION

The invention relates to the field of arrangements for high-frequency filters. Filter devices are known, for example from the U.S. Pat. No. 5,910,756, which comprise a layered arrangement with two piezoelectric layers and three electrodes. A first one of the two piezoelectric layers is positioned between a first, lower electrode of the three electrodes and a second, middle electrode of the three electrodes. The second piezoelectric layer of the two piezoelectric layers is arranged between the middle electrode and a third, upper electrode of the three electrodes. The middle electrode is grounded. This assembly is a conventional piezoelectric bulk acoustic wave resonator (BAWR) which is used as a filter arrangement, for example in mobile radiotelephones. The known filter devices are always configured for the reception/transmission in a single frequency band in such applications. High-frequency filters are thus used which are adapted, for example, to the GSM 900 standard (where GSM stands for Global System Mobile). Other filter devices, however, are configured for the DCS-1800 standard (where DCS stands for Digital Cellular System).

SUMMARY OF THE INVENTION

It is an object of the invention to provide an arrangement based on piezoelectric layers for a filter device which can be used in several frequency ranges, and to provide a method of operating the filter device.

An essential advantage over the prior art achieved by the invention is that a possibility is provided of utilizing layer arrangements with piezoelectric layers for several frequency ranges without any change in the layer arrangement. It is possible by the circuitry means in a simple and inexpensive manner to use the layer arrangement for filter devices which render possible the reception and transmission in various frequency ranges. The incorporation of such filter devices in transmission/reception devices, for example in mobile radiotelephones, leads to a reduced expenditure in the electronic components required. To construct the transmission/reception device for the use in various frequency bands, it is no longer necessary to use several filters which are individually adapted each to a specific frequency band.

A useful further embodiment of the invention provides that the circuitry means for switching over between the one switching state and the other switching state comprise an active electronic component. A reliable possibility for switching over between the switching states is provided thereby at a relatively low cost.

An embodiment of the invention preferred for achieving a high degree of integration of the electronic components provides that the circuitry means for switching over between the one switching state and the other switching state comprise a micromechanical switch.

A simple switch-over between the frequency bands is achieved in an advantageous further embodiment of the invention in that the two piezoelectric layers are made from a material with a high electromechanical coupling constant. Materials which may be used to advantage as materials with a high electromagnetic coupling constant are aluminum nitride (AlN), zinc oxide (ZnO), lanthanum-doped lead zirconate-titanate $PbLa_yZr_xTi_{1-x}O_3$ ($0 \leq x \leq 1$; $0 < y \leq 0.2$), or potassium niobate $KNbO_3$, or other piezoelectric or ferroelectric materials with a high electromechanical coupling constant.

Duplexer filters switchable between two frequency bands and comprising two-band bulk acoustic wave resonators may be constructed on the basis of the layer arrangements with two piezoelectric layers and three electrodes. The transmitter (Tx) and receiver (Rx) branches may be attuned to different frequency ranges (for example, 900 MHz and 1800 MHz) by means of a suitable interconnection of several layer arrangements.

BRIEF DESCRIPTION OF THE DRAWINGS

The invention will be explained in more detail below with reference to embodiments and a drawing, in which.

DETAILED DESCRIPTION OF THE INVENTION

Figure 1:
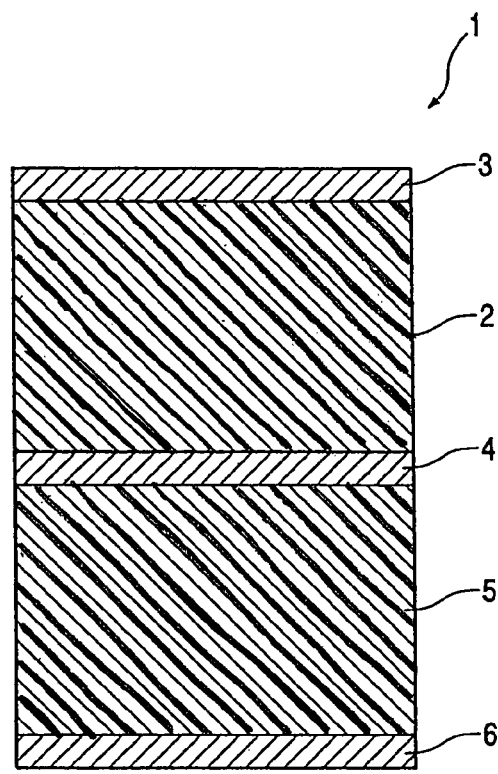
FIG. 1 diagrammatically shows a layer arrangement with two piezoelectric layers and three electrodes.

FIG. 1 shows a layer arrangement 1 in which a piezoelectric layer 2 is positioned between an upper electrode 3 and a middle electrode 4. A further piezoelectric layer 5 lies between the middle electrode 4 and a lower electrode 6.

The layer arrangement 1 can be used as a bulk acoustic wave resonator (BAWR) with the use of circuitry means which are connected to the upper electrode 3 and/or the middle electrode 4 and/or the lower electrode 6 via suitable connections. According to FIG. 2, it is possible through the introduction of high-frequency signals via the upper and lower electrodes 3, 6 to generate a first state in the layer arrangement 1 in which the filter device formed by means the layer arrangement 1 of FIG. 2 has a first resonance frequency. The first resonance frequency is characterized by the particle deflection graphically indicated on the right-hand side in FIG. 2. This may be, for example, a resonance frequency for the 900 MHz frequency band.

Figure 3:
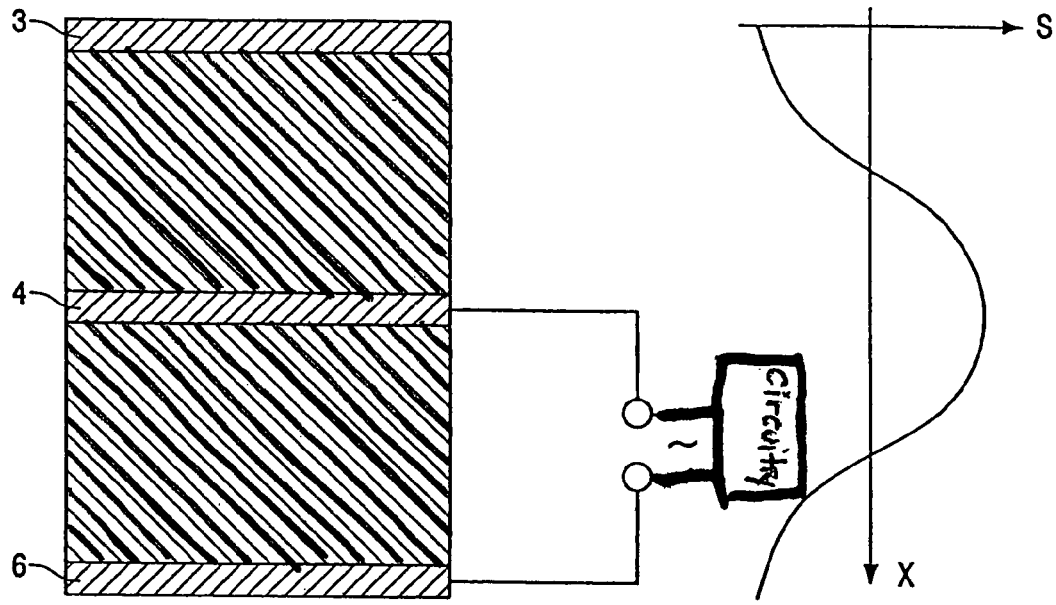
FIG. 3 shows a circuitry for the layer arrangement of FIG. 1 for a different frequency band.
Figure 4:
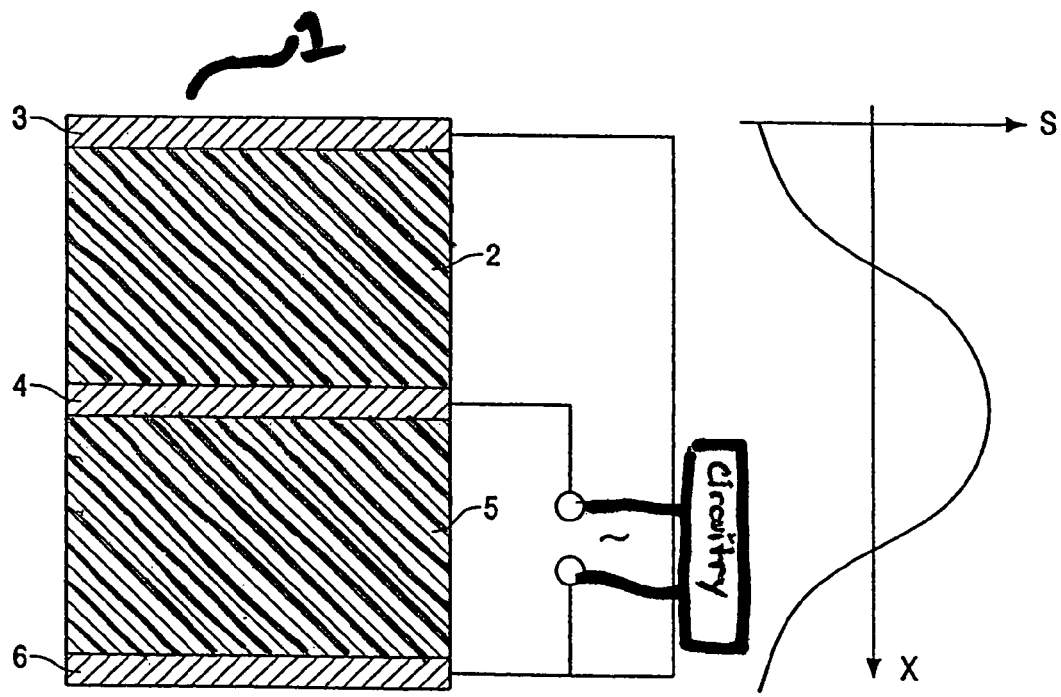
FIG. 4 shows a further circuitry possibility for the layer arrangement of FIG. 1 for the other frequency band.

FIGS. 3 and 4 show circuitry possibilities for the layer arrangement 1 as a result of which the bulk acoustic wave resonator formed thereby is characterized by a resonance frequency in a different frequency range, for example the 1800 MHz frequency band, through the introduction of suitable signals via the electrodes 3, 4, and/or 6.

In FIG. 3, the middle electrode 4 and the lower electrode 6 may be connected to the source of the signals to be introduced. The standing wave generated in the layer arrangement 1 is diagrammatically shown in FIG. 3. A standing wave of a similar type arises when the upper electrode 3, the middle electrode 4, and the lower electrode 6 are connected to the source of the input signals in the manner shown in FIG. 4.

Figure 2:
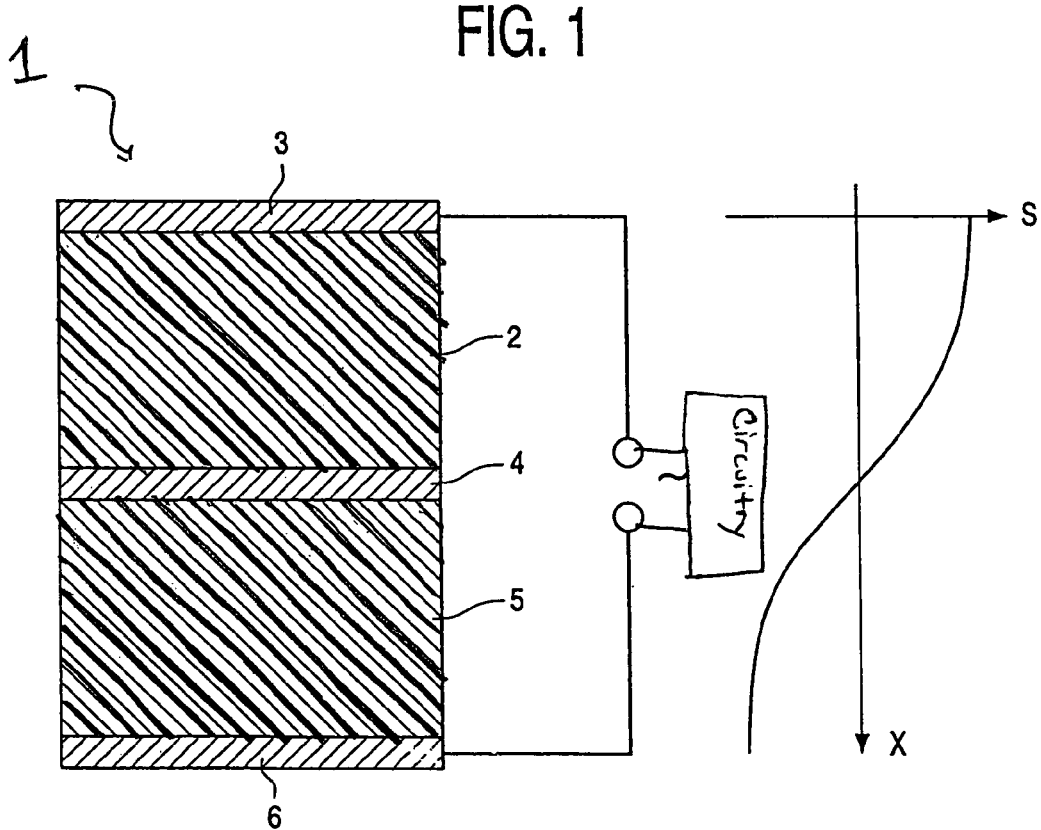
FIG. 2 shows a circuitry for the layer arrangement of FIG. 1 for one frequency band.

Independently of the number of switches used, the layer arrangement 1 may be switched over by the switch(es) between an operational state in which the layer arrangement 1 used as a filter is characterized by a standing wave in accordance with FIG. 2 and another operational state in which the layer arrangement 1 used as a filter is characterized by a standing wave in accordance with FIG. 3 or 4. A filter device formed by means of the layer arrangement 1 may thus be used for several frequency bands without any change in the layer arrangement, solely through the operation of one or several switches. Switches used for this may be, for example, micromechanical switches which are usually based on the silicon technology. Such switches are also called MEM microswitches.

Particularly suitable materials with a high electromagnetic coupling constant for use in the piezoelectric layers 2, 5 are aluminum nitride (AlN), zinc oxide (ZnO), lanthanum-doped lead zirconate-titanate $PbLa_yZr_xTi_{1-x}O_3$ ($0 \leq x \leq 1$; $0 < y \leq 0.2$), $KNbO_3$, or other piezoelectric or ferroelectric materials with a high electromagnetic coupling constant. The high electromagnetic coupling constant of this material has the advantage for the applications that a great filter bandwidth is rendered possible thereby. The piezoelectric layers may be formed from the following materials:
$Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1$, $0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0 \leq x \leq 1$), $Na(Sr_{1-x}Ba_x)_2Nb_5O_{15}$ ($0 \leq x \leq 1$), $BaTiO_3$, $(K_{1-x}Na_x)NbO_3$ ($0 \leq x \leq 1$), $(Bi,Na,K,Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0 \leq x \leq 1$), $a(Bi_xNa_{1-x})TiO_{3-b}(KNbO_{3-c})\frac{1}{2}(Bi_2O_3$—$Sc_2O_3)$ ($0 \leq x \leq 1$, $a+b+c=1$), $(Ba_aSr_bCa_c)Ti_xZr_{1-x}O_3$ ($0 \leq x \leq 1$, $a+b+c=1$), $(Ba_aSr_bLa_c)Bi_4Ti_4O_{15}$ ($a+b+c=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$, and $PbZr_xTi_{1-x}O_3$ ($0 \leq x \leq 1$), with and without dopants of La, Mn, Fe, Sb, Sr, Ni or combinations of these dopants.

Figure 5:
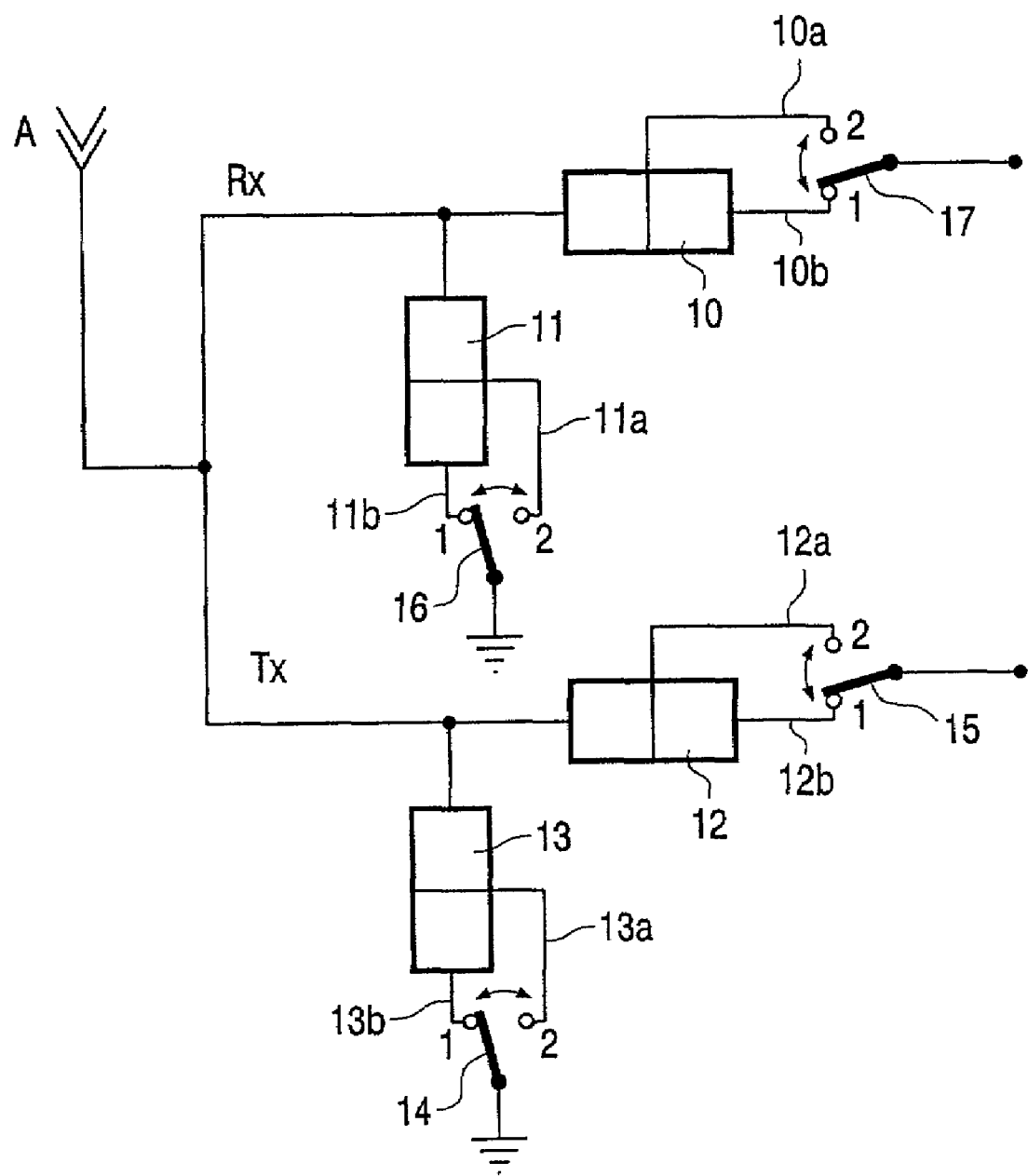
FIG. 5 diagrammatically shows an interconnection of several two-band bulk acoustic wave resonators associated with a filter device.

FIG. 5 shows a combination of several two-band bulk acoustic wave resonators 10, 11, 12, 13 which are each formed by means of a layer arrangement in accordance with FIG. 1. Each middle electrode 10a, 11a, 12a, 13a and one respective further electrode 10b, 11b, 12b, 13b of the plurality of two-band bulk acoustic resonators 10, 11, 12, 13 are connected to respective switches 14, 15, 16, 17. The arrangement of the plurality of two-band bulk acoustic wave resonators is connected to an antenna A. The transmitting (Tx) and the receiving (Rx) branches of the filter device are formed by means of the two-band bulk acoustic wave resonators 10, 11, 12, 13 (duplexer function). The filter device may be switched over between two frequency ranges, i.e. the filter device also has a diplexer filter function. To operate the filter device in a frequency band in accordance with FIG. 5, all switches 14, 15, 16, and 17 should be brought into a switch position ("1"). When the switches 14, 15, 16, 17 are in a different switch position ("2"), the filter device is operated in a different frequency band. The switches 14, 15, 16, and 17 may be micromechanical switches, or active electronic component switches.

The features of the invention disclosed in the above description, in the drawing, and in the claims may be of importance individually as well as in any combination whatsoever for the implementation of the invention in its various embodiments.

The invention claimed is:

1. A filter device, comprising:
    a transmit (Tx) branch having first and second bulk acoustic wave resonators;
    a receiver (Rx) branch having first and second bulk acoustic wave resonators; and
    an antenna, which is connected to the Rx branch and to the Tx branch, wherein:
    each bulk acoustic wave resonator of the Tx branch and the Rx branch further comprises two piezoelectric layers, a first layer of the two piezoelectric layers being arranged between an upper electrode and a middle electrode, and a second layer of the two piezoelectric layers being arranged between a lower electrode and the middle electrode;
    wherein the middle electrode and one of the upper and lower electrodes of each bulk acoustic wave resonator are connected to respective switches, and wherein the bulk acoustic wave resonators of the Tx branch and the Rx branch have a first resonance frequency when the switches are in a first switching state in which the upper and lower electrodes form input and output ports of the bulk acoustic resonator and at least one other resonance frequency different from the at least one resonance frequency when the switches are in a second switching state in which the middle electrode and one of the upper electrode and the lower electrode form input and output ports of the bulk acoustic resonator;
    wherein the piezoelectric layers are capable of conductively isolating the middle electrode from the upper electrode and the lower electrode across the piezoelectric layers.

2. A filter device as recited in claim 1, wherein the middle electrode is conductively isolated from the upper electrode and the lower electrode to prevent the flow of current between the middle electrode and either of the upper or lower electrodes, via the piezoelectric layers, during application of an electric field to the piezoelectric material via at least one of the electrodes.

3. A bulk acoustic resonator (BAW), comprising:
    two piezoelectric layers, a first layer of the two piezoelectric layers being arranged between an upper electrode and a middle electrode, and a second layer of the two piezoelectric layers being arranged between a lower electrode and the middle electrode; and
    the upper, lower and middle electrode electrodes are connected to circuitry that applies high-frequency signals to at least one of the two piezoelectric layers such that the bulk acoustic wave resonator has at least one resonance frequency when the circuitry is in a first switching state in which the upper and lower electrodes form input and output ports of the bulk acoustic resonator and at least one other resonance frequency different from the at least one resonance frequency when the circuitry is in a second switching state in which the middle electrode and one of the upper electrode and the lower electrode form input and output ports of the bulk acoustic resonator;
    wherein the piezoelectric layers are capable of conductively isolating the middle electrode from the upper electrode and the lower electrode across the piezoelectric layers.

4. A BAW as claimed in claim 3, wherein the middle electrode is conductively isolated from the upper electrode and the lower electrode to prevent the flow of current between the middle electrode and either of the upper or lower electrodes, via the piezoelectric layers, during application of an electric field to the piezoelectric material via at least one of the electrodes.

5. A BAW as claimed in claim 3, wherein the two piezoelectric layers are comprised of one or more of AlN, ZnO, $KnbO_3$, or lanthanum-doped lead zirconate-titanate ($PbLa_xZr_yTi_{1-y}O_3$) ($0 \leq x \leq 1$; $0 < y \leq 0.2$).

6. A BAW as claimed in claim 3, wherein the circuitry includes an active electronic component.

7. A BAW as claimed in claim 3, wherein the circuitry includes a micromechanical switch.

8. A BAW as claimed in claim 3, wherein the two piezoelectric layers are comprised of a material with a high electromechanical coupling constant.

9. A filter device, comprising:
- a transmit (Tx) branch having at least one bulk acoustic wave resonator;
- a receiver (Rx) branch having at least one bulk acoustic wave resonator; and
- an antenna, which is connected to the Rx branch and to the Tx branch, wherein:
- each of the at least one bulk acoustic wave resonators of the Tx branch and the Rx branch further comprises two piezoelectric layers, a first layer of the two piezoelectric layers being arranged between an upper electrode and a middle electrode, and a second layer of the two piezoelectric layers being arranged between a lower electrode and the middle electrode, wherein the piezoelectric layers are capable of conductively isolating the middle electrode from the upper electrode and the lower electrode across the piezoelectric layers; and
- the upper, lower and middle electrode electrodes are connected to circuitry that applies high-frequency signals to at least one of the two piezoelectric layers such that each of the at least one of the bulk acoustic wave resonators of the Tx branch and the Rx branch have at least one resonance frequency when the circuitry is in a first switching state in which the upper and lower electrodes form input and output ports of the bulk acoustic resonator and at least one other resonance frequency different from the at least one resonance frequency when the circuitry is in a second switching state in which the middle electrode and one of the upper electrode and the lower electrode form input and output ports of the bulk acoustic resonator.

10. A filter device as recited in claim 9, wherein the filter device is a duplexer filter switchable between two frequency bands.

11. A filter device as recited in claim 9, wherein the circuitry further comprises at least one micromechanical switch.

12. A filter device as recited in claim 9, wherein the circuitry further comprises at least one active component switch.

13. A filter device as recited in claim 9, wherein the two piezoelectric layers of each bulk acoustic wave resonator of the Tx branch and the Rx branch are comprised of a material with a high electromechanical coupling constant.

14. A filter device as recited in claim 9, wherein the two piezoelectric layers of each bulk acoustic wave resonator of the Tx branch and the Rx branch are comprised of one or more of AlN, ZnO, KnbO$_3$, or lanthanum-doped lead zirconate-titanate (PbLa$_x$Zr$_y$Ti$_{1-y}$O$_3$) ($0 \leqq x \leqq 1; 0 < y \leqq 0.2$).

15. A filter device as recited in claim 9, wherein the middle electrode is conductively isolated from the upper electrode and the lower electrode to prevent the flow of current between the middle electrode and either of the upper or lower electrodes, via the piezoelectric layers, during application of an electric field to the piezoelectric material via at least one of the electrodes.

* * * * *